(12) United States Patent
Morita

(10) Patent No.: US 7,294,201 B2
(45) Date of Patent: Nov. 13, 2007

(54) METHOD OF MANUFACTURING CRYSTAL OF III-V COMPOUND OF THE NITRIDE SYSTEM, CRYSTAL SUBSTRATE OF III-V COMPOUND OF THE NITRIDE SYSTEM, CRYSTAL FILM OF III-V COMPOUND OF THE NITRIDE SYSTEM, AND METHOD OF MANUFACTURING DEVICE

(75) Inventor: Etsuo Morita, Kanagawa (JP)

(73) Assignee: Sony Corporation, Tokyo (JP)

( * ) Notice: Subject to any disclaimer, the term of this patent is extended or adjusted under 35 U.S.C. 154(b) by 80 days.

(21) Appl. No.: 09/728,193

(22) Filed: Nov. 30, 2000

(65) Prior Publication Data
US 2001/0003019 A1  Jun. 7, 2001

(30) Foreign Application Priority Data
Dec. 1, 1999 (JP) .............................. P11-341637

(51) Int. Cl.
*C30B 25/04* (2006.01)
(52) U.S. Cl. .................... 117/90; 117/94; 117/923; 438/669; 438/412; 438/481
(58) Field of Classification Search ................ 117/97, 117/84, 923, 90; 438/669, 412, 481
See application file for complete search history.

(56) References Cited

U.S. PATENT DOCUMENTS

| | | | | |
|---|---|---|---|---|
| 4,803,691 A | * | 2/1989 | Scifres et al. .................. | 372/45 |
| 4,952,526 A | * | 8/1990 | Pribat et al. ................ | 117/923 |
| 5,418,799 A | * | 5/1995 | Tada ...................... | 372/44.011 |
| 5,672,520 A | * | 9/1997 | Natsume ...................... | 356/401 |
| 5,689,123 A | * | 11/1997 | Major et al. ................. | 257/190 |
| 6,051,876 A | * | 4/2000 | Gardner et al. ............. | 257/634 |
| 6,225,650 B1 | * | 5/2001 | Tadatomo et al. .......... | 257/190 |
| 6,271,104 B1 | * | 8/2001 | Razeghi et al. ............. | 438/481 |
| 6,294,440 B1 | * | 9/2001 | Tsuda et al. ................ | 438/479 |
| 6,319,742 B1 | * | 11/2001 | Hayashi et al. ............... | 438/46 |
| 6,358,854 B1 | * | 3/2002 | Fleming et al. ............. | 438/692 |

OTHER PUBLICATIONS

Chen et al, "Dislocation reduction in GaN thin films via lateral overgrowth from trenches", Applied Physics Letters, vol. 75, No. 14, p. 2062-63 (1999).*

* cited by examiner

*Primary Examiner*—Duane Smith
*Assistant Examiner*—Matthew J. Song
(74) *Attorney, Agent, or Firm*—Sonnenschein Nath & Rosenthal LLP

(57) ABSTRACT

A crystal substrate and a crystal film of a III-V compound of the nitride system which are manufactured easily and have few dislocations as well as a method of manufacturing a crystal and a method of manufacturing a device with the use thereof are disclosed. On a basal body, formed in order are a base crystal layer of, for example, gallium nitride (GaN), a first mask pattern of, for example, silicon dioxide ($SiO_2$), an intermediate crystal layer of, for example, gallium nitride, a second mask pattern of, for example, silicon dioxide, and a top crystal layer of, for example, gallium nitride. The first and second mask patterns have stripes arranged at least in one direction at unequally spaced intervals. The stripes are different in pitch from pattern to pattern. Thus, the mask patterns at least partly overlie one another in the direction of the thickness of the crystal layers.

17 Claims, 9 Drawing Sheets

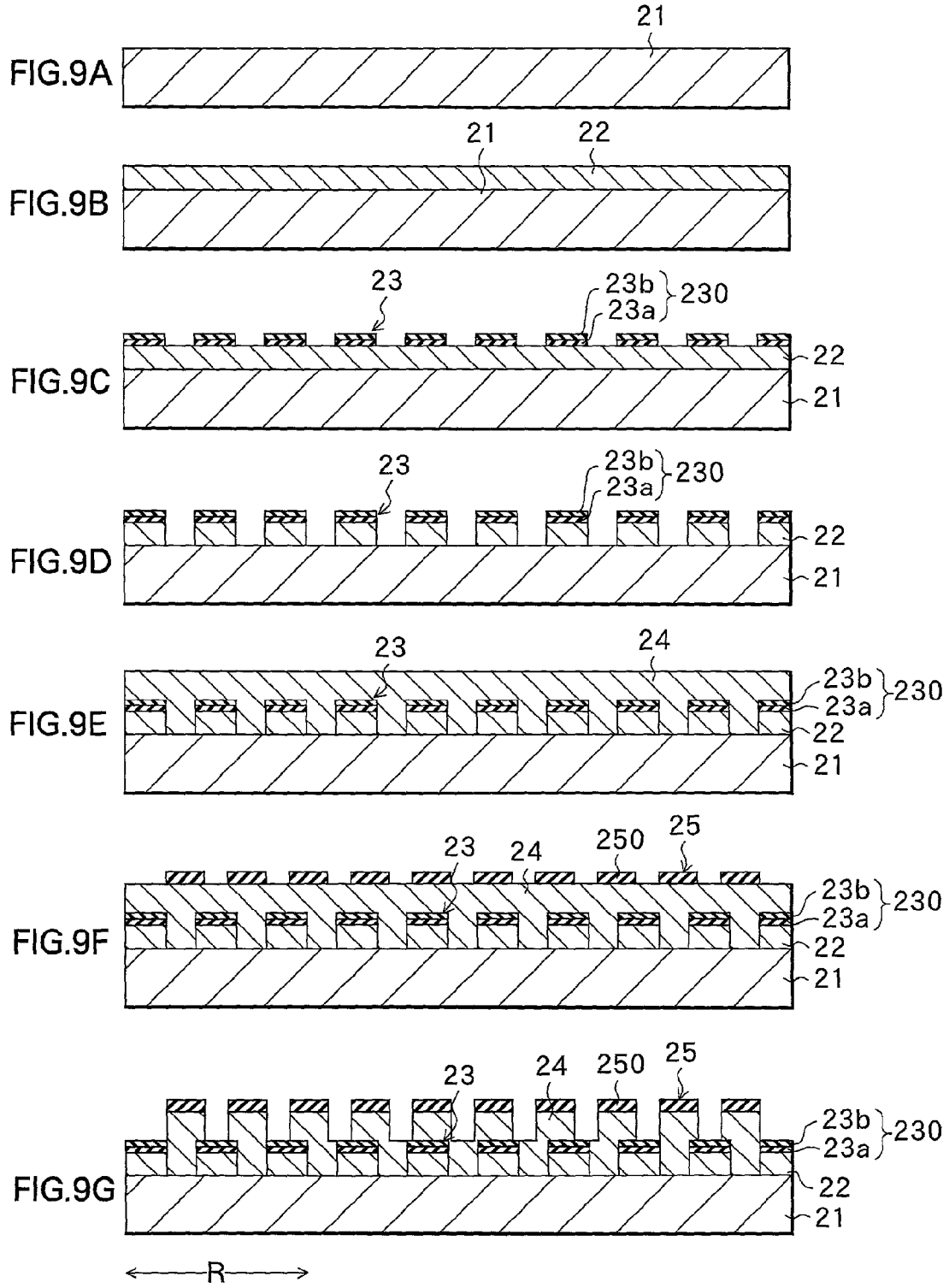

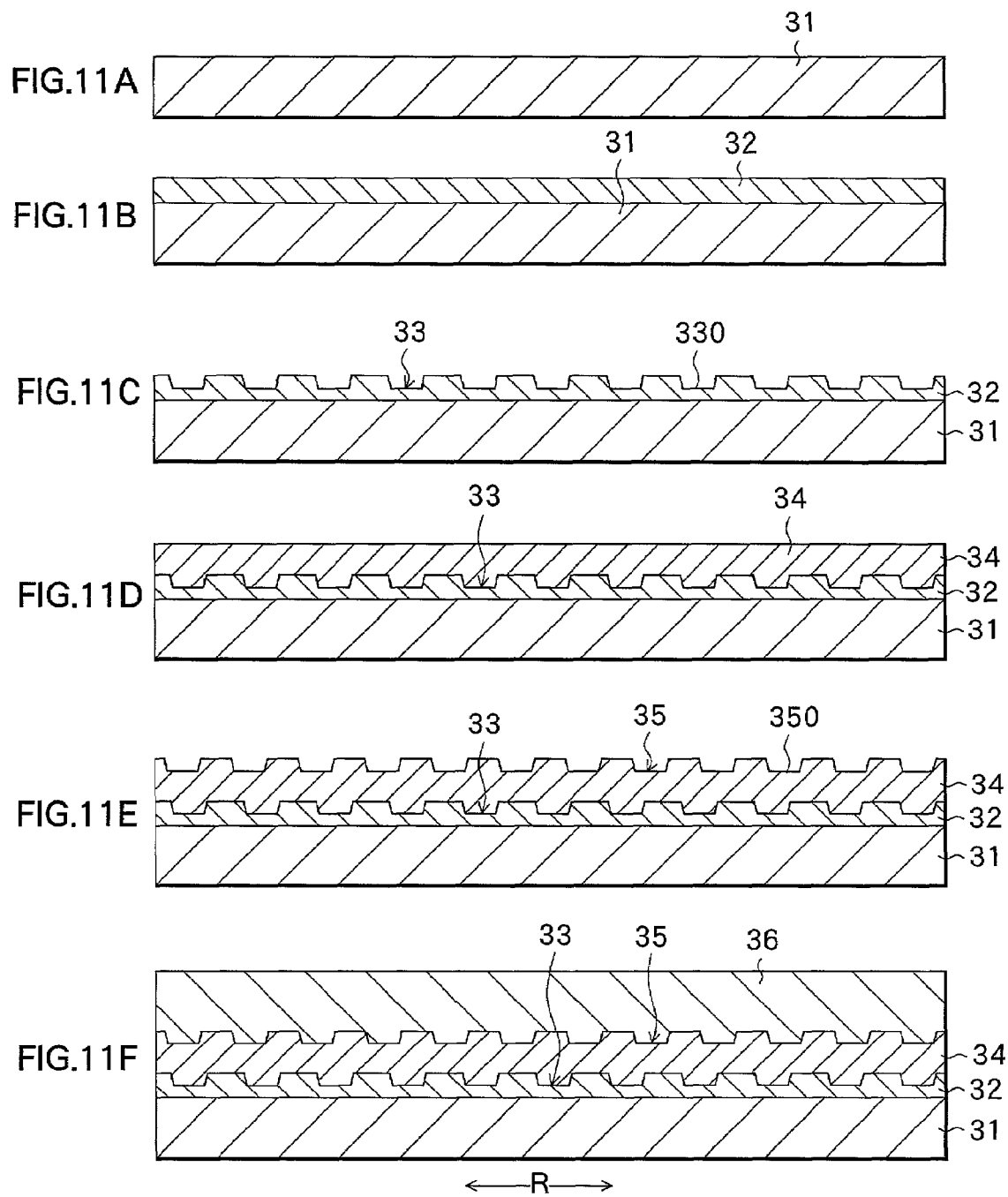

METHOD OF MANUFACTURING CRYSTAL OF III-V COMPOUND OF THE NITRIDE SYSTEM, CRYSTAL SUBSTRATE OF III-V COMPOUND OF THE NITRIDE SYSTEM, CRYSTAL FILM OF III-V COMPOUND OF THE NITRIDE SYSTEM, AND METHOD OF MANUFACTURING DEVICE

The present application claims priority from Japanese Patent Application No. 11-341637, dated Dec. 1, 1999.

BACKGROUND OF THE INVENTION

1. Field of the Invention

The invention relates to a method of manufacturing a device such as a semiconductor laser device. The invention also relates to a crystal substrate of a III-V compound of the nitride system and a crystal film of a III-V compound of the nitride system, which are used for the method of manufacturing a device. The invention also relates to a method of manufacturing a crystal of a III-V compound of the nitride system, which is used for manufacturing the crystal substrate or the crystal film.

2. Description of the Related Art

In general, the manufacturing process of a device such as a semiconductor laser device or a light-emitting diode (LED) involves the deposition of semiconductor films or the like laid one upon another over the surface of a crystal substrate or a crystal film comprised of a III-V compound of the nitride system, e.g., gallium nitride (GaN). A desirable method to obtain a crystal substrate or a crystal film for the use in the manufacturing process is to form a bulk of a crystal of a III-V compound of the nitride system, but the manufacture of a bulk of a crystal of a III-V compound of the nitride system is difficult. Thus, it has been the practice to grow epitaxially a crystal of a III-V compound of the nitride system on a basal body made of sapphire ($Al_2O_3$).

However, the difference in the crystal structures of the basal body and the crystal formed thereon, or the small interaction between the basal body and the crystal formed thereon causes dislocations to occur from the interface. Such dislocations develop in the direction of crystal growth, and pierce the crystal to reach its surface. This causes a problem that crystal substrates or crystal films thus grown have numerous defects.

To overcome the problem, Publication of Japanese Unexamined Patent Application No. Hei 10-312971 proposes a method in which a gallium nitride (GaN) base layer is formed over the surface of a sapphire ($Al_2O_3$) basal body, and a mask pattern made of silicon dioxide ($SiO_2$) is formed over the base layer, and then a gallium nitride (GaN) crystal is grown on the surface of the base layer with the mask pattern in between. According to the method proposed, the development of dislocations is prevented by the mask pattern, resulting in a reduction in the number of dislocations piercing the crystal to reach its surface. The method, however, cannot sufficiently reduce the number of dislocations in crystal substrates or crystal films because some dislocations develop through windows of the mask pattern to pierce the crystal.

Thus, the above-noted Publication discloses another method in which two mask patterns are formed in the direction of the thickness of the crystal so that a dislocation developing through a window of one mask pattern is blocked by another mask pattern. This method, however, requires accurate alignment of two mask patterns in the direction of the thickness of the crystal so that one mask pattern is laid over the windows of another mask pattern, causing a problem of difficult work.

In their Extended Abstracts (The 46th Spring Meeting, 1999; page 416), the Japan Society of Applied Physics and Related Societies disclosed a method in which a base layer made of gallium nitride (GaN) or the like is formed over a sapphire ($Al_2O_3$) basal body, and a recessed region is formed in the surface of the base layer, and a gallium nitride (GaN) crystal is grown over the surface of the base layer. Since the method causes a change in the direction of the development of a dislocation at the recessed region of the base layer, the number of dislocations piercing the crystal reduces to some extent. In the method, however, dislocations developing off the recessed region of the base layer pierce the crystal. Thus, the method has a problem that the number of dislocations piercing the crystal cannot be reduced sufficiently.

On the other hand, MRS internet J. Nitride Semicond. Res. 4S1, G3. 38 (1999) and MRS Internet J. Nitride Semicond. Res. 4S1, G4. 9 (1999) proposed methods of preventing dislocations piercing the crystal using lateral growth. In the former method, a gallium nitride (GaN) crystal as a seed crystal is etched to form a groove, and the crystal growth is re-started in the lateral direction from the walls of the groove. In the latter method, a mask pattern for etching is formed on the surface of a gallium nitride (GaN) crystal as a seed crystal, and the crystal growth is re-started in the lateral direction from the walls of the groove, while the mask pattern prevents the crystal growth over the surface of the seed crystal. However, with the former method, there is a possibility that dislocations will develop from the surface of the seed crystal. With the latter method, there is a possibility that new dislocations will develop above the mask pattern. Thus, both methods have a problem that dislocations piercing the crystal cannot be prevented sufficiently.

SUMMARY OF THE INVENTION

The invention has been achieved to overcome the above-described problems. An object of the invention is to provide a crystal substrate of a III-V compound of the nitride system and a crystal film of a III-V compound of the nitride system which are manufactured easily and have few dislocations piercing the crystal, a method of manufacturing a crystal of a III-V compound of the nitride system for the manufacture thereof, and a method of manufacturing a device with the use thereof.

A method of manufacturing a crystal of a III-V compound of the nitride system according to the invention comprises a growth step of growing a crystal of a III-V compound of the nitride system having a predetermined thickness on the surface of a basal body, wherein the growth step comprises forming a plurality of patterns in separate positions in the direction of the thickness of the crystal, and the plurality of patterns at least partly overlie one another in the direction of the thickness of the crystal and at least partly do not overlie one another in the direction of the thickness of the crystal.

A crystal substrate of a III-V compound of the nitride system according to the invention is a crystal substrate having a plurality of patterns formed in separate positions in the direction of the thickness of the crystal substrate, wherein the plurality of patterns at least partly overlie one another in the direction of the thickness of the crystal substrate, and at least partly do not overlie one another in the direction of the thickness of the crystal substrate.

A crystal film of a III-V compound of the nitride system according to the invention is a crystal film having a plurality of patterns formed in separate positions in the direction of the thickness of the crystal film, wherein the plurality of patterns at least partly overlie one another in the direction of the thickness of the crystal film and at least partly do not overlie one another in the direction of the thickness of the crystal film.

A method of manufacturing a device according to the invention comprises: a growth step in which the crystal substrate or the crystal film is formed by growing a crystal of a III-V compound of the nitride system having a predetermined thickness on the surface of a basal body; and a device film formation step in which the predetermined device film is formed on the crystal substrate or on the crystal film, wherein the growth step comprises forming a plurality of patterns in separate positions in the direction of the thickness of the crystal, and the plurality of patterns at least partly overlie one another in the direction of the thickness of the crystal and at least partly do not overlie one another in the direction of the thickness of the crystal.

In the method of manufacturing a crystal of a III-V compound of the nitride system, the crystal substrate of a III-V compound of the nitride system, the crystal film of a III-V compound of the nitride system and the method of manufacturing a device according to the invention, it is ensured that the development of dislocations is prevented in a region where a plurality of patterns do not overlie one another in the direction of the thickness of the crystal. Moreover, there is a region where the patterns overlie one another and a region where the patterns do not overlie one another, and both regions coexist. This causes a region where the plurality of patterns do not overlie one another (that is, a region where it is ensured that the development of dislocations is prevented) to be provided without accurate alignment of the patterns.

Other and further objects, features and advantages of the invention will appear more fully from the following description.

BRIEF DESCRIPTION OF THE DRAWINGS

FIGS. 9A to 9G are cross sections for illustrating steps of a method of manufacturing a crystal of a III-V compound of the nitride system according to a second embodiment of the invention.

FIGS. 11A to 11F are cross sections for illustrating steps of a method of manufacturing a crystal of a III-V compound of the nitride system according to a third embodiment of the invention.

DETAILED DESCRIPTION OF THE PREFERRED EMBODIMENTS

Figure 1A:
FIGS. 1A to 1F are cross sections for illustrating steps of a method of manufacturing a crystal of a III-V compound of the nitride system according to a first embodiment of the invention.

Embodiments of the invention will now be described in detail below by referring to the drawings.

(First Embodiment)

FIGS. 1A to 1F are cross sections for illustrating steps of a method of manufacturing a crystal of a III-V compound of the nitride system according to a first embodiment of the invention. The purpose of the method of manufacturing a crystal is to manufacture a crystal substrate of a III-V compound of the nitride system for the formation of, for example, a semiconductor laser device or a light-emitting diode (LED). In the description given herein, a gallium nitride (GaN) crystal is formed as a III-V compound of the nitride system.

As shown in FIG. 1A, a basal body 11 is used. The basal body 11 is made of, for example, sapphire ($Al_2O_3$) having a lattice constant and a coefficient of thermal expansion approximately equal to those of gallium nitride (GaN), which is a III-V compound of the nitride system. Examples of the materials of the basal body 11 other than sapphire ($Al_2O_3$) are silicon (Si), silicon carbide (SiC), gallium arsenide (GaAs), magnesium aluminum composite oxide ($MgAl_2O_4$), lithium gallium composite dioxide ($LiGaO_2$) and gallium nitride (GaN).

Figure 1B:
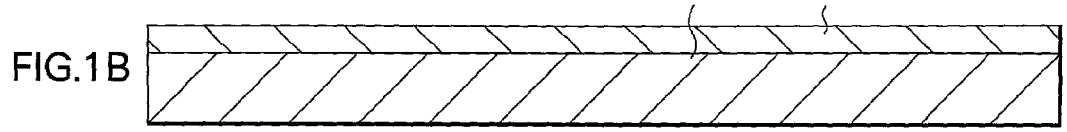

Next, as shown in FIG. 1B, over the basal body 11, a gallium nitride (GaN) crystal is grown using, for example, metal organic chemical vapor deposition (MOCVD), molecular beam epitaxy (MBE) or other vapor deposition. Thereby, a base crystal layer 12 having a thickness of, for example, 2 μm is deposited.

Figure 1C:
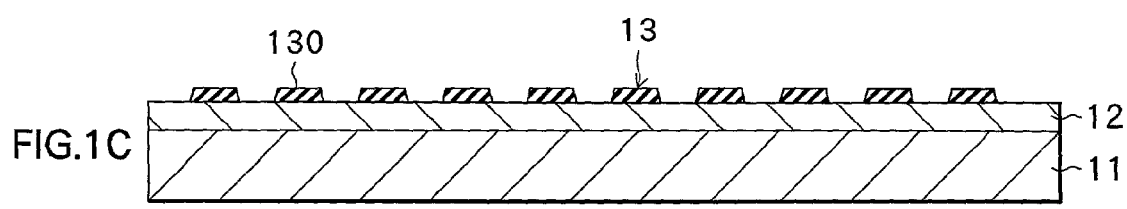

Subsequently, as shown in FIG. 1C, over the surface of the base crystal layer 12, a layer of silicon dioxide ($SiO_2$) or silicon nitride ($Si_3N_4$) is deposited by, for example, sputtering. Then, the layer is patterned using, for example, photolithography and dry etching, and thereby a first mask pattern 13 is formed. The first mask pattern 13 has a number of parallel stripes 130 arranged at 4 μm intervals. Each stripe 130 has a width of 5 μm. The pitch of the stripes 130, i.e., the sum of the width and interval of the stripes, is 9 μm. The thickness of the stripes 130 of the first mask pattern 13 is, for example, 0.2 μm.

Figure 1D:
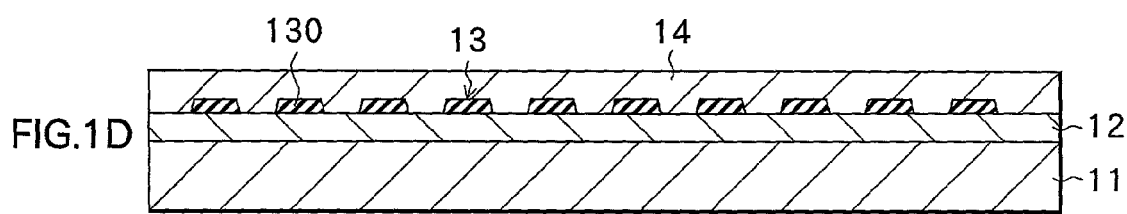

Next, as shown in FIG. 1D, an intermediate crystal layer 14 is deposited by growing a gallium nitride (GaN) crystal layer over the surface of the base crystal layer 12, using, for example, MOCVD. Specifically, the gallium nitride (GaN) crystal growth is started at a region uncovered with the stripes 130 of the first mask pattern 13, in the surface of the base crystal layer 12. The gallium nitride (GaN) crystal is grown to become thick enough to cover the first mask pattern 13 completely. The thickness of the intermediate crystal layer 14 is, for example, 8 μm.

Figure 1E:
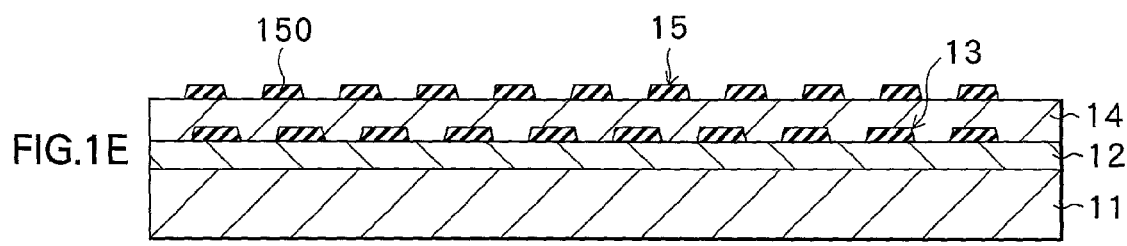

Thereafter, as shown in FIG. 1E, a layer comprised of silicon dioxide ($SiO_2$) or silicon nitride ($Si_3N_4$) is deposited over the surface of the intermediate crystal layer 14 using, for example, sputtering. The layer is then patterned using, for example, photolithography and dry etching, and thereby a second mask pattern 15 is formed. The second mask pattern 15 is comprised of a number of stripes 150 arranged at 4 μm intervals in the same direction as the first mask pattern. Each stripe 150 has a width of 4 μm. The pitch of the stripes 150 is 8 μm.

Figure 1F:
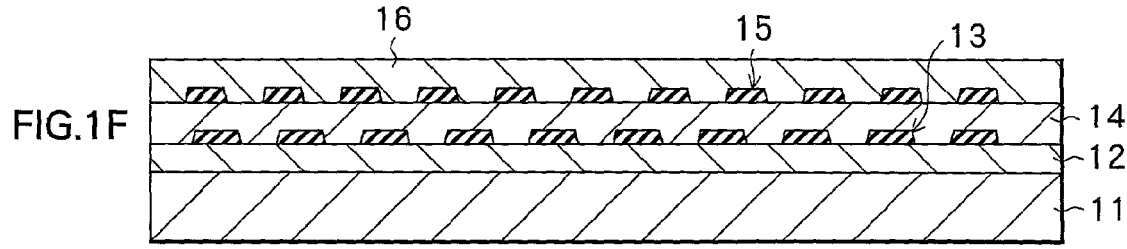

Next, as shown in FIG. 1F, another gallium nitride (GaN) crystal layer is grown over the surface of the intermediate crystal layer 14 using, for example, MOCVD. Thereby, a top crystal layer 16 is deposited. Specifically, the gallium nitride (GaN) crystal growth is started at a region uncovered with the stripes 150 of the second mask pattern 15, in the surface of the intermediate crystal layer 14. The gallium nitride (GaN) crystal is grown to become thick enough to cover the second mask pattern 15 completely. The thickness of the top crystal layer 16 is, for example, 8 μm. Thus, a crystal substrate 10 as shown in FIG. 1F is formed.

The crystal substrate 10 corresponds to a specific example of a 'crystal substrate' in the invention or a specific example of a 'crystal film' in the invention. The base crystal layer 12, the intermediate crystal layer 14 and the top crystal layer 16 in combination correspond to a specific example of a 'crystal' in the invention. The first mask pattern 13 and the second mask pattern 15 correspond to a specific example of 'a plurality of patterns' in the invention. In addition, the stripes 130 and the stripes 150 each correspond to a specific example of 'pattern elements' in the invention. Further, the base crystal layer 12, the intermediate crystal layer 14 and the top crystal layer 16 correspond to specific examples of a 'base layer', an 'intermediate layer' and a 'top layer' in the invention, respectively.

Figure 2:
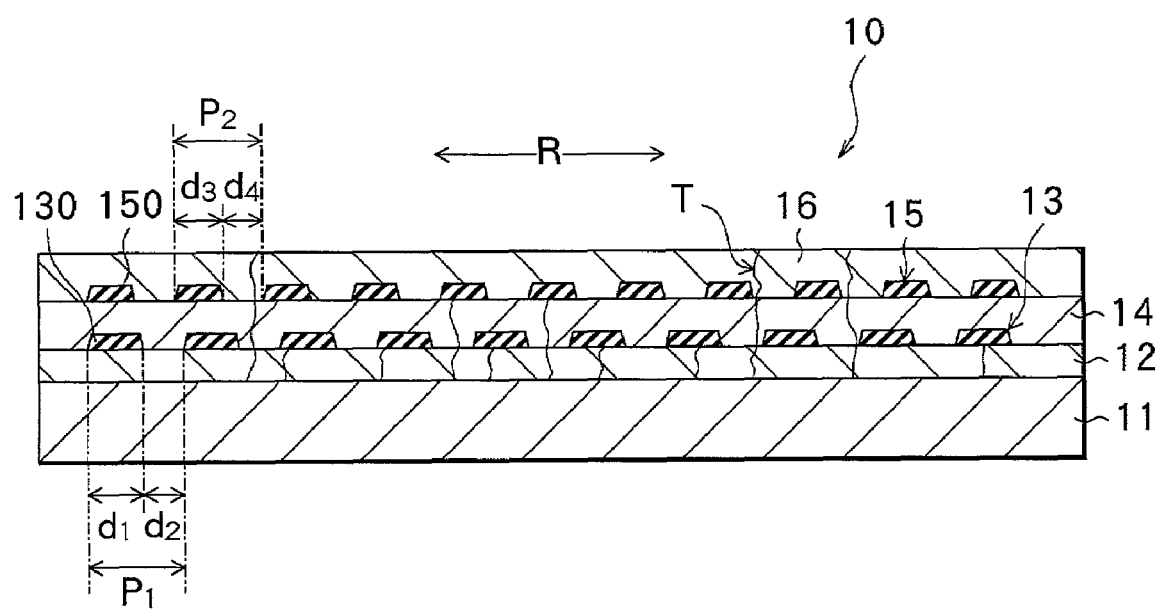
FIG. 2 is a cross section of a crystal substrate.

FIG. 2 is a cross section for illustrating the form of the first mask pattern 13 and the second mask pattern 15 in the crystal substrate 10. As noted above, for the first mask pattern 13, the width $d_1$ of the stripe 130 is 5 μm, and the interval $d_2$ is 4 μm. The pitch $p_1$ is given by summing up the width $d_1$ and the interval $d_2$, and equals to 9 μm. For the second mask pattern 15, the width $d_3$ of the stripe 150 is 4 μm, and the interval $d_4$ is 4 μm. The pitch $p_2$ is given by summing up the width $d_3$ and the interval $d_4$, and equals to 8 μm. The pitches of the first mask pattern 13 and the second mask pattern 15 are different from each other. Therefore, as denoted by the reference character R in FIG. 2, there is a region in which the stripes of one mask pattern overlie the windows of another mask pattern. Over the region R, a semiconductor laser device is made as described below.

Figure 3:
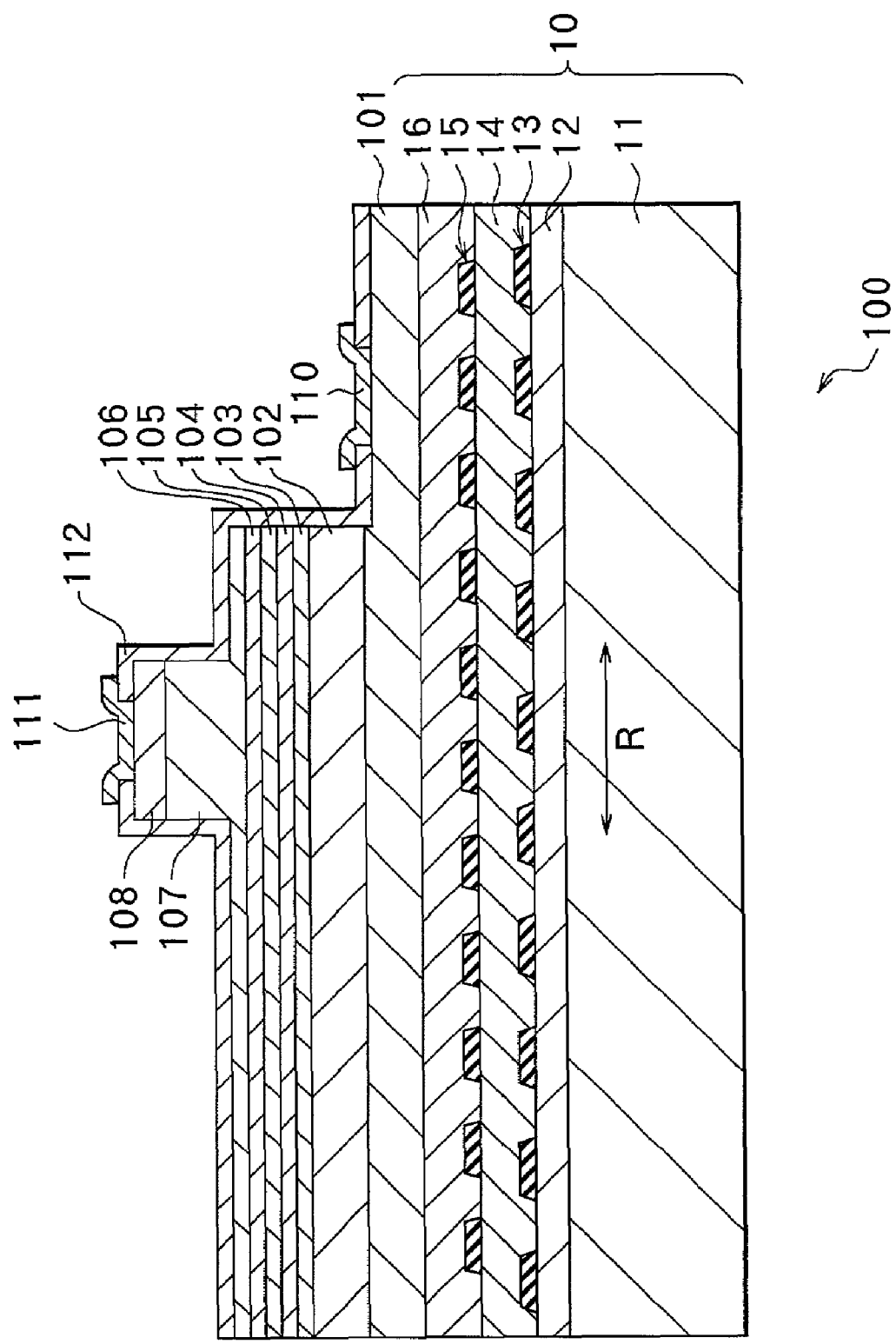
FIG. 3 is a cross section for illustrating a step following FIG. 1F.

FIG. 3 is a cross section of a semiconductor laser device 100 made using the crystal substrate 10. The semiconductor laser device 100 is made as follows. First, over the surface of the crystal substrate 10, a gallium nitride (GaN) film doped with a desired amount of silicon (Si) is grown using, for example, MOCVD. Thereby, an n-type contact layer 101 comprised of n-type gallium nitride (GaN) is formed. Over the n-type contact layer 101, an aluminum gallium nitride (AlGaN) film doped with a desired amount of silicon (Si) is grown to form a cladding layer 102 comprised of n-type aluminum gallium nitride (AlGaN). Over the cladding layer 102, a gallium nitride (GaN) film doped with a desired amount of silicon (Si) is deposited to form a guide layer 103 comprised of n-type gallium nitride (GaN). Over the guide layer 103, a gallium indium nitride (GaInN) film is deposited to form an active layer 104 having a multiple quantum well structure.

Over the active layer 104, an aluminum gallium nitride (AlGaN) film doped with a desired amount of magnesium (Mg) is deposited to form a cap layer 105 comprised of p-type aluminum gallium nitride (AlGaN). Over the cap layer 105, a gallium nitride (GaN) film doped with a desired amount of magnesium (Mg) is grown to form a guide layer 106 comprised of p-type gallium nitride (GaN). Over the guide layer 106, an aluminum gallium nitride (AlGaN) film doped with a desired amount of magnesium (Mg) is deposited to form a cladding layer 107 comprised of p-type aluminum gallium nitride (AlGaN). Over the cladding layer 107, a gallium nitride (GaN) film doped with a desired amount of magnesium (Mg) is deposited to from a p-type contact layer 108 comprised of p-type gallium nitride (GaN). Then, the p-type contact layer 108 and the cladding layer 107 are patterned in stripes using, for example, dry etching. Thus, what we call laser stripes are formed.

Then, in correspondence with the position where an n-electrode 110 is to be formed, the cladding layer 102, the guide layer 103, the active layer 104, the cap layer 105, the guide layer 106, the cladding layer 107 and the p-type contact layer 108 are removed using, for example, photolithography. Thereby, the n-type contact layer 101 is exposed. Next, while the entire surface is covered with an insulating film 112, the n-electrode 110 and a p-electrode 111 are formed. The n-electrode 110 has a structure in which titanium (Ti), aluminum (Al), platinum (Pt) and gold (Au) are laid one upon another and alloyed by heat treatments. The p-electrode 111 has a structure in which nickel (Ni), platinum (Pt) and gold (Au) are laid one upon another and alloyed by heat treatments.

Thus, the semiconductor laser device 100 as shown in FIG. 3 is obtained. The laser stripe as a light-emitting portion, i.e., the patterned p-type contact layer 108 and the patterned cladding layer 107, is formed above the region where the stripes of the second mask patterns 15 overlie the windows of the first mask pattern 13. The guide layers 103 and 106 sandwiching the active layer 104 have larger refractive indexes than the active layer 104, and thereby forming a structure in which the light is confined by both of the guide layers 103 and 106.

The semiconductor laser device 100 corresponds to a specific example of a 'device' in the invention. The lamination from the n-type contact layer 101 to the p-type contact layer 108 corresponds to a specific example of a 'device film' in the invention.

Description now moves to the effects of the first embodiment. Dislocations, denoted by the reference character T in FIG. 2, occur at the interface between the basal body 11 and the base crystal layer 12, and develop in the direction approximately orthogonal to the surface of the basal body 11 as the base crystal layer 12 or others grow. In this case, in the region R, the second mask pattern 15 does not overlie the first mask pattern 13 in the direction of the thickness of the crystal substrate 10. That is, the stripes of one pattern overlie the windows of another pattern. Thus, part of dislocations are prevented from further development by the stripes 130 of the first mask pattern 13. The remaining dislocations are prevented from further development by the stripes 150 of the second mask pattern 15. In other words, in the region R, it is ensured that no dislocations reach the surface of the crystal substrate 10.

Furthermore, the pitch $p_1$ of the first mask pattern 13 and the pitch $p_2$ of the second mask pattern 15 are different from each other. Therefore, as long as the stripes 130 and the stripes 150 are arranged parallel to one another, it is possible to provide the region R where the second mask pattern 15 does not overlie the first mask pattern 13. This makes it unnecessary to align accurately the first mask pattern 13 and the second mask pattern 15, facilitating the manufacture. That is, it becomes possible to obtain a high quality crystal substrate having no dislocations piercing the crystal substrate without making the manufacturing process complicated.

The pitch $p_1$ of the stripes 130 of the first mask pattern 13 and the pitch $p_2$ of the stripes 150 of the second mask pattern 15 may be optionally set as required. For example, in the case of the manufacture of the semiconductor laser device 100, the interval between two laser stripes (i.e., the cladding layers 107 and the p-type contact layers 108) formed on the crystal substrate 10 is from 1 μm to 5 μm, both inclusive. To provide one to ten region(s) R having no dislocations piercing the crystal substrate 10 in the region having a width of 1 μm to 5 μm, both inclusive, the pitch $p_1$ of the stripes 130 of the first mask pattern 13 and the pitch $p_2$ of the stripes 150 of the second mask pattern 15 are to satisfy the following expression (1):

$$0.1 \ \mu m < p_1 \times p_2 / |p_2 - p_1| < 5000 \ \mu m \qquad (1)$$

(First Modification)

A first modification of the embodiment will now be described below. The modification is the same as the first embodiment except for the form of the second mask pattern. In the following, the same parts as the first embodiment are designated by similar reference characters, and the detailed description thereof will be omitted.

Figure 4:
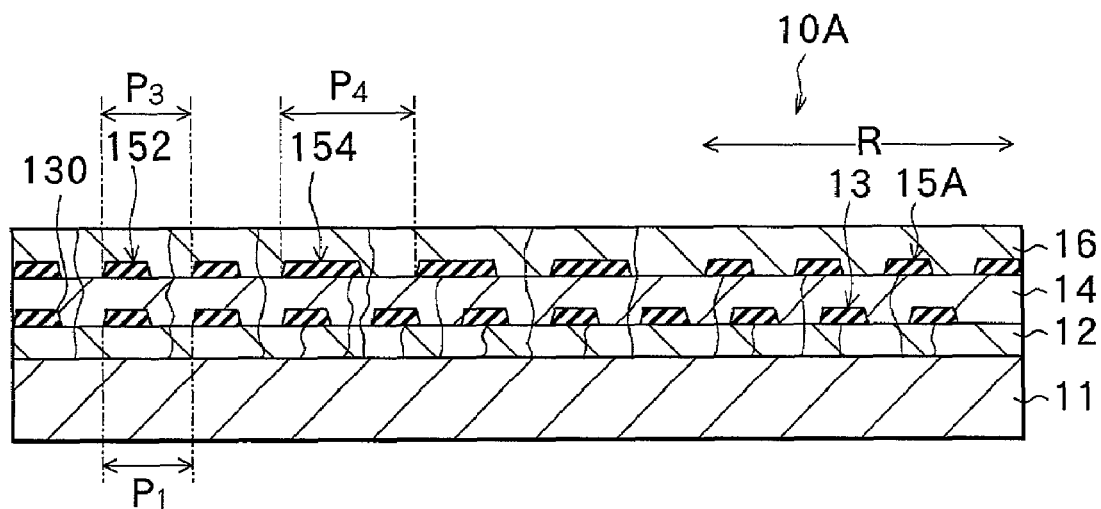
FIG. 4 is a cross section of a crystal substrate according to a first modification of the first embodiment.

FIG. 4 is a cross section of a crystal substrate 10A according to the first modification. In the crystal substrate 10A, the first mask pattern 13 is defined in the same form as in the first embodiment. The second mask pattern 15A is constructed in the form of two kinds of stripes of different pitches. For example, the second mask pattern 15A comprises stripes 152 arranged at 5 μm intervals and stripes 154 arranged at 5 μm intervals. Each stripe 152 has a width of 4 μm while each stripe 154 has a width of 7 μm. In this case, the pitch $p_3$ of the stripes 152 is 9 μm, and the pitch $p_4$ of the stripes 154 is 12 μm. These two kinds of stripes may be combined regularly or at random fashion.

As described above, the second mask pattern 15A has two kinds of stripes of different pitches. Therefore, as long as the first mask pattern 13 and the second mask pattern 15A are arranged so that the stripes thereof are arranged parallel to one another, it is possible to provide the region R where the second mask pattern 15A does not overlie the first mask pattern 13. In the region R, it is ensured that, as in the first embodiment, the occurrence of dislocations piercing the crystal substrate 10A is prevented. Thus, it becomes possible to obtain a high quality crystal substrate or crystal film having no dislocations piercing the crystal without making the manufacturing process complicated.

In the modification, the second mask pattern 15A has two kinds of stripes of different pitches. However, the second mask pattern 15A may have three or more kinds of stripes of different pitches. Further, the first mask pattern 13 may have a plurality of kinds of stripes of different pitches.

(Second Modification)

A second modification of the embodiment will now be explained below. The modification is the same as the first embodiment except for the form of the second mask pattern. In the following, the same parts as the first embodiment are designated by similar reference characters, and the detailed description thereof will be omitted.

Figure 5:
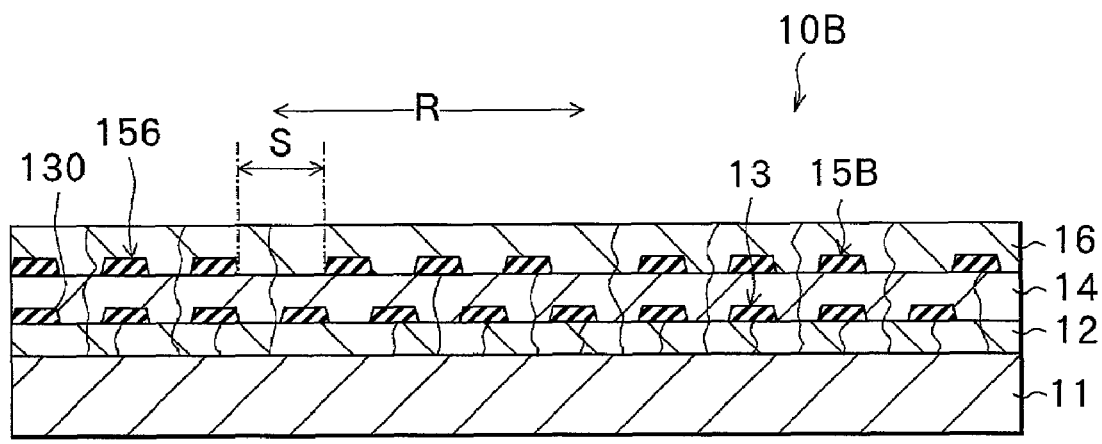
FIG. 5 is a cross section of a crystal substrate according to a second modification of the first embodiment.

FIG. 5 is a cross section of a crystal substrate 10B according to the second modification. The first mask pattern 13 is defined in the same form as in the first embodiment. On the other hand, for the second mask pattern 15B, the stripes are arranged at two different intervals. Specifically, the second mask pattern 15B has stripes 156 arranged at, for example, 4 μm intervals. Each stripe 156 has a width of 5 μm. However, as denoted by the reference character S in the figure, in part of the second mask pattern 15B, the stripes 156 are arranged at different intervals (for example, 7 μm intervals). The part where the stripes 156 are arranged at different intervals may be provided regularly or at random fashion.

As described above, in part of the second mask pattern 15B, the stripes 156 are arranged at different intervals. Therefore, as long as the first mask pattern 13 and the second mask pattern 15B are arranged so that the stripes thereof are arranged parallel to one another, it is possible to provide the region R where the second mask pattern 15B does not overlie the first mask pattern 13. Thus, it becomes possible to obtain a high quality crystal substrate or crystal film having no dislocations piercing the crystal without making the manufacturing process complicated.

Instead of arranging the stripes 156 at different intervals in part of the second mask pattern 15A, it may be possible for the stripes 156 to have different widths in part of the second mask pattern 15A. In another alternative, in part of the first mask pattern 13, the stripes 130 may be arranged at different intervals or may have different widths.

(Third Modification)

Figure 6:
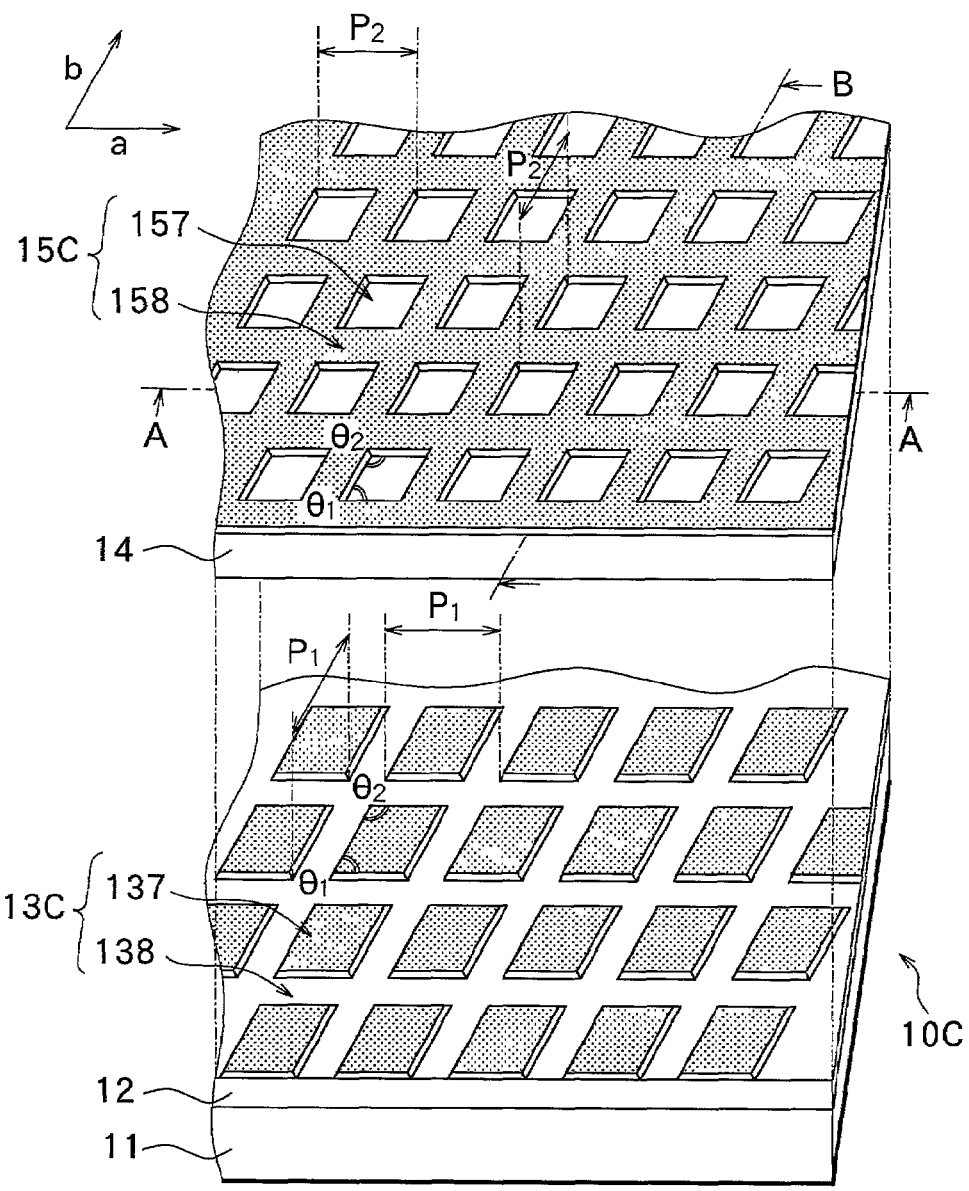
FIG. 6 is a perspective view of a crystal substrate according to a third modification of the first embodiment.

A third modification of the embodiment will now be described below. FIG. 6 is a view for illustrating the structure of a crystal substrate 10C according to the third modification. The modification is the same as the first embodiment except for the forms of the first mask pattern 13C and the second mask pattern 15C. In the following, the same parts as the first embodiment are designated by similar reference characters, and the detailed description thereof will be omitted. In FIG. 6, the top crystal layer 16 is omitted.

As shown in FIG. 6, the first mask pattern 13C has rhombus masks 137 and windows 138 surrounding the masks 137. Each mask 137 is in the form of a rhombus with minor interior angles $\theta_1$ of 60° and major interior angles $\theta_2$ of 120°. The masks 137 are arranged at equally spaced intervals in two directions (hereinafter referred to as the direction a and the direction b), each direction being parallel to a set of two parallel sides of a rhombus. The second mask pattern 15C has rhombus windows 157 and masks 158 surrounding the windows 157. Each window 157 is in the form of a rhombus with minor interior angles $\theta_1$ of 60° and major interior angles $\theta_2$ of 120°. The windows 157 are formed so that two sets of parallel sides of a rhombus are in the direction a and in the direction b. The windows 157 are arranged at equally spaced intervals in the direction a and in the direction b.

The masks 137 of the first mask pattern 13C are arranged at the pitch $p_1$. The pitch $p_1$ is equal in the direction a and in the direction b. The windows 157 of the second mask pattern 15C are arranged at the pitch $p_2$. The pitch $p_2$ is equal in the direction a and in the direction b. In both mask patterns, the pitch in the direction a is the same as the pitch in the direction b. Therefore, regions where the windows 157 of the second mask pattern 15C overlie the masks 137 of the first mask pattern 13C are provided at equally spaced intervals both in the direction a and in the direction b. To illustrate, take the pitch $p_1$ to be 8 μm and take the pitch $p_2$ to be 9 μm. Then, the regions where the windows 157 of the second mask pattern 15C overlie the masks 137 of the first mask pattern 13C are provided at 72 μm intervals both in the direction a and in the direction b.

Figure 7:
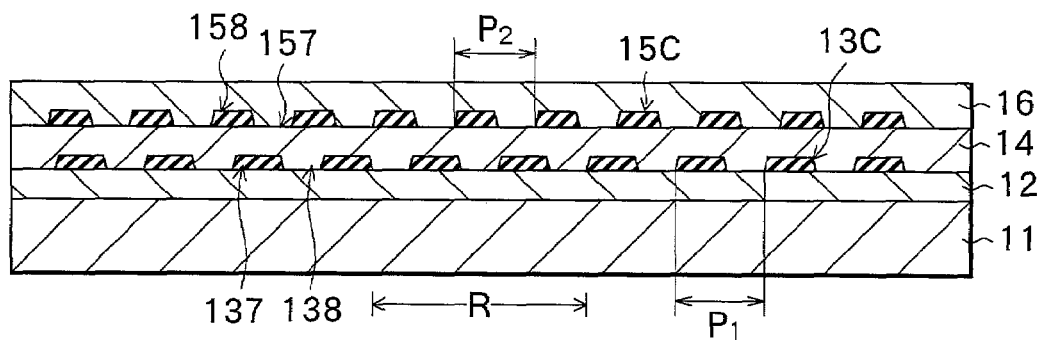
FIG. 7 is a cross section of a crystal substrate shown in FIG. 6.

FIG. 7 is a cross section taken in the direction a (that is, a cross section taken along line A-A) of the crystal substrate 10C shown in FIG. 6. FIG. 7 is the same as a cross section taken in the direction b (that is, a cross section taken along line B-B). As shown in FIG. 7, the regions R where the windows of one mask pattern overlie the masks of another mask pattern constitute regions where no dislocations reach the surface of the crystal substrate 10C, i.e., regions with no dislocations piercing the crystal substrate 10C.

As noted above, in accordance with the modification, the regions where the windows 157 overlie the masks 137 appear at, for example, 72 μm intervals in the direction a and in the direction b, only by laying the second mask pattern 15C above the first mask pattern 13C so that the second mask pattern 15C and the first mask pattern 13C are aligned in the direction of rotation (that is, so that the direction of arrangement of the masks 137 is parallel to that of the windows 157). This makes it easy to align the first mask pattern 13C and the second mask pattern 15C.

The preferable forms of the masks 137 and the windows 157 other than a rhombus are a triangle (particularly, an equilateral triangle), a hexagon (particularly, an equilateral hexagon) and a parallelogram (particularly, a parallelogram having interior angles of 60° or 90°). Also, preferably, the regions where the windows of one mask pattern overlie the masks of another mask pattern appear at equally spaced intervals in two directions. In another alternative, the regions where the windows of one mask pattern overlie the masks of another mask pattern may appear in one direction at integral multiples of the interval in the other direction.

(Fourth Modification)

Figure 8:
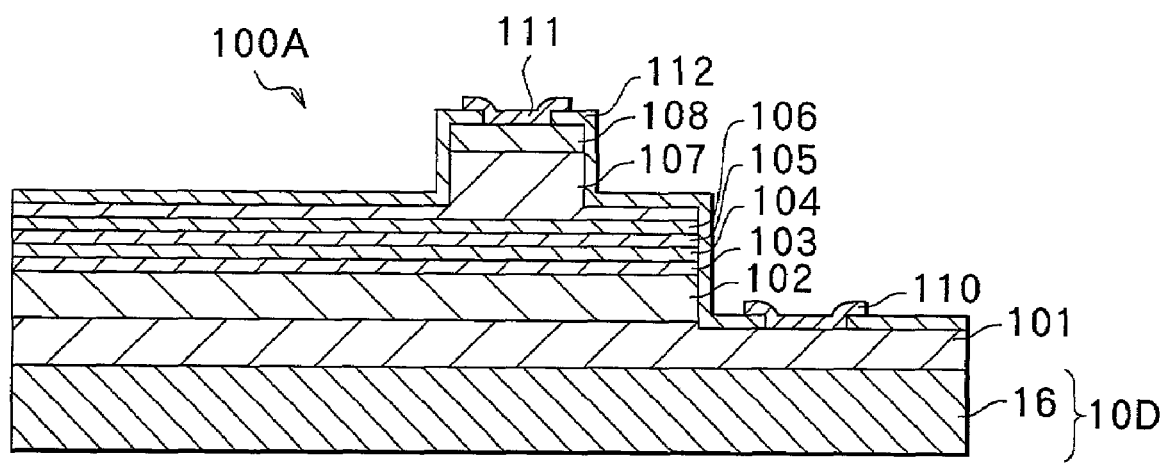
FIG. 8 is a cross section of a semiconductor laser device according to a fourth modification of the first embodiment.

A fourth modification of the embodiment will now be explained below. In the first embodiment and the first to third modifications thereof, as shown in FIG. 1F, the basal body 11 and the crystal layers 12, 14 and 16 in combination are referred to as the crystal substrate 10. It is possible, however, to remove the basal body 11 and some crystal layer(s) and to obtain a crystal substrate comprising only the top crystal layer 16 (or a crystal substrate comprising the top crystal layer 16 and another crystal layer). Examples of methods of removing the basal body 11 or the like are laser light irradiation and vibration using ultrasonic waves. A crystal substrate thus manufactured may be used for the manufacture of a semiconductor laser device. FIG. 8 is a cross section for illustrating an example of a semiconductor laser device 100A made using a crystal substrate 10D comprising only the top crystal layer 16. Each layer in the device formed on the crystal substrate 10D is formed as in the first embodiment shown in FIG. 3.

In forming the base crystal layer 12, the intermediate crystal layer 14 and the top crystal layer 16 of the crystal substrate 10, if each layer is doped with, for example, silicon (Si) which makes the grown crystal n-type, a crystal substrate having n-type conductivity is obtained. The use of a crystal substrate having n-type conductivity makes it possible to cope with a laser structure in which an electrode is formed on the back of a crystal substrate.

(Second Embodiment)

Description is now made with regard to a method of manufacturing a crystal of a III-V compound of the nitride system according to a second embodiment of the invention. FIGS. 9A to 9G and FIGS. 10A and 10B are cross sections for illustrating steps of the method of manufacturing a crystal of a III-V compound of the nitride system according to the embodiment.

Referring to FIG. 9A, as in the first embodiment, a basal body 21 made of, for example, sapphire ($Al_2O_3$) is used. Examples of the materials of the basal body 21 other than sapphire ($Al_2O_3$) are silicon (Si), silicon carbide (SiC), gallium arsenide (GaAs), magnesium aluminum composite oxide ($MgAl_2O_4$), lithium gallium composite dioxide ($LiGaO_2$) and gallium nitride (GaN).

Next, as shown in FIG. 9B, over the basal body 21, a gallium nitride (GaN) crystal is grown using, for example, MOCVD, MBE or other vapor deposition. Thereby, a base crystal layer 22 is deposited.

Subsequently, as shown in FIG. 9C, a film is deposited over the surface of the base crystal layer 22. The film comprises two layers of silicon dioxide ($SiO_2$) and silicon nitride ($Si_3N_4$) laid one upon another in the order named. Then, the film is patterned using photolithography and dry etching, and thereby a first mask pattern 23 is formed. The first mask pattern 23 has a number of parallel stripes 230 arranged at 4 μm intervals. Each stripe 230 has a width of 5 μm, and includes a lower layer 23a made of silicon nitride ($Si_3N_4$) and an upper layer 23b made of silicon dioxide ($SiO_2$). The pitch of the stripes 230 is 9 μm.

Next, as shown in FIG. 9D, using, for example, dry etching through the first mask pattern 23 as windows, portions uncovered with the first mask pattern 23 in the base crystal layer 22 are selectively removed. The deepness of grooves formed by etching is selected so that the base crystal layer 22 is removed enough to expose the basal body 21. Preferably, the dry etching process is performed using, for example, reactive ion etching (RIE).

As shown in FIG. 9E, an intermediate crystal layer 24 is deposited by growing a gallium nitride (GaN) crystal over the base crystal layer 22 using, for example, MOCVD. In this case, the growth of the intermediate crystal layer 24 mainly starts at the walls of the grooves formed by etching in the base crystal layer 22. The intermediate crystal layer 24 is grown to become thick enough to cover the first mask pattern 23 completely.

Thereafter, as shown in FIG. 9F, a layer comprised of silicon dioxide ($SiO_2$) is deposited over the surface of the intermediate crystal layer 24 using, for example, sputtering. The layer is then patterned using photolithography and dry etching, and thereby a second mask pattern 25 is formed. The second mask pattern 25 is comprised of a number of stripes 250 arranged at 4 μm intervals. Each stripe 250 has a width of 4 μm. The pitch of the stripes 250 is 8 μm.

Next, as shown in FIG. 9G, using dry etching by, for example, RIE through the second mask pattern 25 as windows, portions uncovered with the second mask pattern 25 in the intermediate crystal layer 24 are selectively removed. The deepness of grooves formed by etching is selected so that the intermediate crystal layer 24 is removed enough to expose the first mask pattern 23. In this case, since the first mask pattern 23 serves as an etching stopper, the portions of the intermediate crystal layer 24 below the first mask pattern 23 are not removed.

Figure 10A:
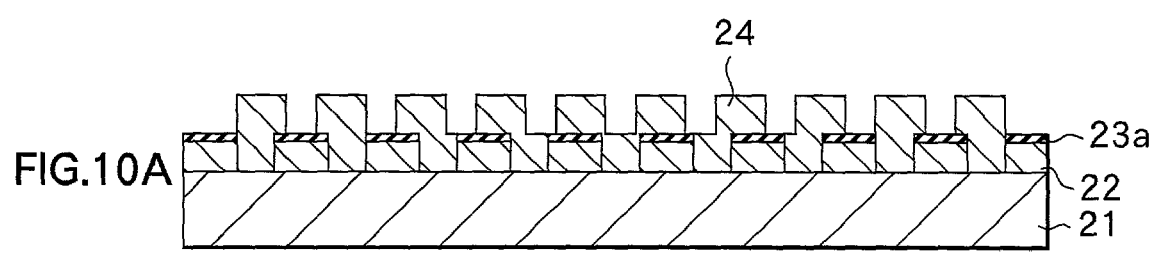
FIGS. 10A and 10B are cross sections for illustrating steps following FIG. 9F.

Then, as shown in FIG. 10A, the second mask pattern 25 (see FIG. 9G) made of silicon dioxide ($SiO_2$) is completely removed using, for example, a solution of hydrogen fluoride in water. In this case, of the first mask pattern 23, the upper layer 23b comprised of silicon dioxide ($SiO_2$) is removed, while the lower layer 23a comprised of silicon nitride ($Si_3N_4$) is not removed and remains.

Figure 10B:
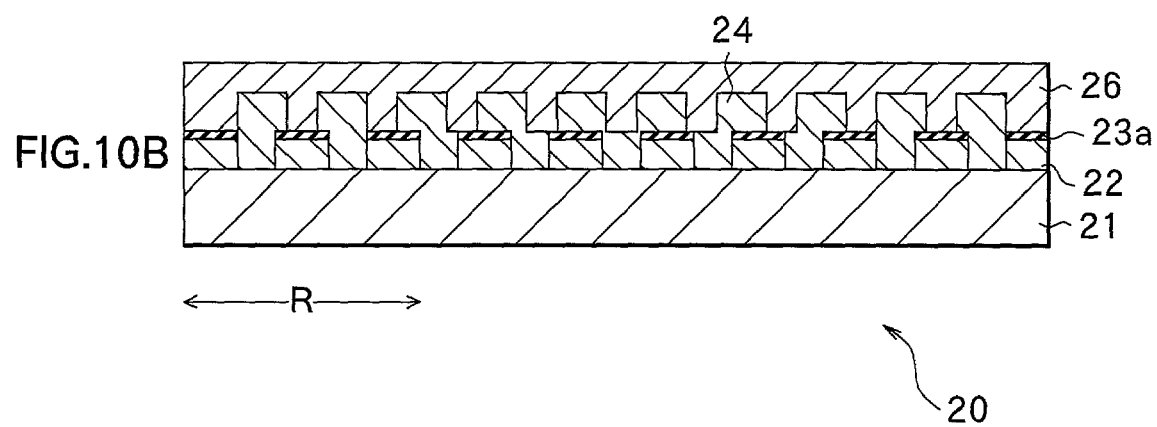

Thereafter, as shown in FIG. 10B, another gallium nitride (GaN) crystal layer is grown over the surface of the intermediate crystal layer 24 and around the intermediate crystal layer 24 using, for example, MOCVD. Thereby, a top crystal layer 26 is deposited. The growth of the top crystal layer 26 mainly starts at the walls of the groove formed by etching in the intermediate crystal layer 24. Thus, a crystal substrate 20 as shown in FIG. 10B is formed. Over the surface of the crystal substrate 20, a multi-layer film constituting a semiconductor laser device is grown. The deposition process of the multi-layer film constituting a semiconductor laser device is the same as the first embodiment as shown in FIG. 3, and further description thereof will be omitted herein. The crystal substrate 20 may be a crystal film.

In the embodiment, the basal body 21 and the crystal layers 22, 24 and 26 in combination are referred to as the crystal substrate 20. It is possible, however, to remove the basal body 21, the base crystal layer 22 and the intermediate crystal layer 24 (and, in addition, part of the top crystal layer 26) and to obtain a crystal substrate comprising only the top crystal layer 26 having an optimum crystal structure. A crystal substrate thus obtained may be used for the manufacture of a semiconductor laser device.

The crystal substrate 20 corresponds to a specific example of a 'crystal substrate' or a specific example of a 'crystal film' in the invention. The base crystal layer 22, the intermediate crystal layer 24 and the top crystal layer 26 in combination correspond to a specific example of a 'crystal' in the invention. The first mask pattern 23 and the intermediate crystal layer 24 etched correspond to a specific example of 'a plurality of patterns' in the invention. In addition, the stripes 230 and the stripes 250 each correspond a specific example of 'pattern elements' in the invention. Furthermore, the base crystal layer 22, the intermediate crystal layer 24 and the top crystal layer 26 correspond to specific examples of a 'base layer', an 'intermediate layer' and a 'top layer' in the invention, respectively.

Description now moves to the effects of the embodiment. In FIG. 9E, dislocations occurring at the interface between the basal body 21 and the base crystal layer 22 develop in the direction approximately orthogonal to the surface of the basal body 21 as the base crystal layer 22 or others grow. The growth of the intermediate crystal layer 24 starts at the walls of the groove formed by etching in the base crystal layer 22. Thus, dislocations occurring in the base crystal layer 22 are prevented from propagation through the intermediate crystal layer 24.

In the region denoted by the reference character R in FIG. 9G, the windows of the second mask pattern 25 overlie the stripes 230 of the first mask pattern 23. Even if new dislocations develop from above the stripes 230 of the first mask pattern 23, the portion of the intermediate crystal layer 24 above the stripe 230 are removed in the region R. This considerably reduces the possibility that dislocations propagate through the top crystal layer 26. Thus, as in the first embodiment, in the crystal substrate 20, the region R with few dislocations piercing the crystal substrate 20 is provided.

Furthermore, the pitch of the stripes 230 of the first mask pattern 23 and the pitch of the stripes 250 of the second mask pattern 25 are different from each other. Therefore, as long as the stripes 230 and the stripes 250 are arranged parallel to one another, it is possible to provide the region R where the second mask pattern 25 does not overlie the first mask pattern 23. Thus, it becomes possible to obtain a crystal substrate or a crystal film having no dislocations piercing the crystal without making the manufacturing process complicated.

As in the first embodiment, the pitch $p_1$ of the stripes 230 of the first mask pattern 23 and the pitch $p_2$ of the stripes 250 of the second mask pattern 25 may be optionally set so that the expression (1) mentioned above is satisfied. The first to fourth modifications of the first embodiment are also applicable to the second embodiment.

(Third Embodiment)

Description is now given concerning a method of manufacturing a crystal of a III-V compound of the nitride system according to a third embodiment of the invention. FIGS. 11A to 11F are cross sections for illustrating steps of a method of manufacturing a crystal of a III-V compound of the nitride system according to the embodiment.

As shown in FIG. 11A, as in the first and second embodiments, a basal body 31 is used. The basal body 31 is made of, for example, sapphire ($Al_2O_3$) having a lattice constant and a coefficient of thermal expansion approximately equal to those of gallium nitride (GaN), which is a III-V compound of the nitride system. Next, as shown in FIG. 11B, over the basal body 31, a gallium nitride (GaN) crystal is grown using, for example, MOCVD, MBE or other vapor deposition. Thereby, a base crystal layer 32 is deposited.

Subsequently, as shown in FIG. 11C, a number of indentations 330 in the form of stripes are formed in the base crystal layer 32 by, for example, dry etching. Thereby, a first indented pattern 33 is formed. The indentations 330 of the first indented pattern 33 are formed in the form of parallel stripes arranged in one direction at 4 μm intervals. Each stripe has a width of 5 μm. The pitch $p_1$ of the stripes is 9 μm.

Next, as shown in FIG. 11D, an intermediate crystal layer 34 is deposited by growing a gallium nitride (GaN) crystal layer over the surface of the base crystal layer 32 by, for example, MOCVD. Thereafter, as shown in FIG. 11E, a number of indentations 350 in the form of stripes are formed in the surface of the intermediate crystal layer 34 by, for example, dry etching. Thereby, a second indented pattern 35 is defined. The indentations 350 of the second indented pattern 35 are formed in the form of parallel stripes arranged in one direction at 4 μm intervals. Each stripe has a width of 4 μm. The pitch $p_2$ of the stripes is 8 μm.

Next, as shown in FIG. 11F, another gallium nitride (GaN) crystal layer is grown over the surface of the intermediate crystal layer 34 using, for example, MOCVD. Thereby, a top crystal layer 36 is deposited. Thus, a crystal substrate 30 as shown in FIG. 11F is formed. Over the surface of the crystal substrate 30, a multi-layer film constituting a semiconductor laser device is grown. The deposition process of the multi-layer film constituting a semiconductor laser device is the same as the first embodiment as shown in FIG. 3, and further description thereof will be omitted herein. The crystal substrate 30 may be a crystal film.

The crystal substrate 30 corresponds to a specific example of a 'crystal substrate' in the invention or a specific example of a 'crystal film' in the invention. The base crystal layer 32, the intermediate crystal layer 34 and the top crystal layer 36 in combination correspond to a specific example of a 'crystal' in the invention. The first indented pattern 33 and the second indented pattern 35 correspond to a specific example of 'a plurality of patterns' in the invention. In addition, the stripes 330 and the stripes 350 each correspond to a specific example of 'pattern elements' in the invention. Further, the base crystal layer 32, the intermediate crystal layer 34 and the top crystal layer 36 correspond to specific examples of a 'base layer', a 'intermediate layer' and a 'top layer' in the invention, respectively.

Reference is now made to FIG. 11F, explaining the effects of the embodiment. The pitch of the first indented pattern 33 and the pitch of the second indented pattern 35 are different from each other. Therefore, in the region denoted by the reference character R in FIG. 11F, the second indented pattern 35 does not overlie the first indented pattern 33.

Dislocations, although not shown, occurring at the interface between the basal body 31 and the base crystal layer 32 develop in the direction approximately orthogonal to the surface of the basal body 31 as the base crystal layer 32 or others grow. However, for some dislocations occurring in the region R, the direction of their development is changed to the lateral direction by the indentations 330 of the first indented pattern 33. The remaining dislocations develop off the indentations (that is, through projections) of the first indented pattern 33, but the direction of their development is changed to the lateral direction by the indentations 350 of the second indented pattern 35. Thus, as in the first and second embodiments, in the crystal substrate 30, the region R with few dislocations piercing the crystal substrate 30 is formed.

Furthermore, the pitch of the first indented pattern 33 and the pitch of the second indented pattern 35 are different from each other. Therefore, as long as the indentations 330 and the indentations 350 of the two indented patterns are arranged parallel to one another, it is possible to provide the region R where the second indented pattern 35 does not overlie the first indented pattern 33. Thus, as in the first and second embodiments, it becomes possible to obtain a crystal substrate or a crystal film having no dislocations piercing the crystal without making the manufacturing process complicated.

As in the first embodiment, the pitch $p_1$ of the indentations 330 of the first indented pattern 33 and the pitch $p_2$ of the indentations 350 of the second indented pattern 35 may be optionally set so that the expression (1) mentioned above is satisfied. The first to fourth modifications of the first embodiment are also applicable to the third embodiment.

The invention has been described above by referring to the embodiments. However, the invention is not limited to the embodiments, but various changes and modifications are possible. For example, in the above-described embodiments, a multi-layer film constituting a semiconductor laser device is deposited over the surface of a crystal substrate. However, instead of a semiconductor laser device, it is possible to form a light-emitting diode, a semiconductor device or the like. Moreover, the above-described embodiments relate to the case of forming a semiconductor laser device of separate confinement heterostructure (SCH) in which a guide layer is provided between an active layer and a cladding layer. However, the embodiments are also applicable to other laser structures of various kinds.

As described above, in accordance with a method of manufacturing a crystal of a III-V compound of the nitride system, a crystal substrate of a III-V compound of the nitride system, a crystal film of a III-V compound of the nitride system or a method of manufacturing a device according to the invention, a plurality of patterns are formed in separate positions in the direction of the thickness of the crystal, and the plurality of patterns at least partly overlie one another in the direction of the thickness of the crystal and at least partly do not overlie one another in the direction of the thickness of the crystal. This makes it possible to prevent dislocations from reaching the surface of the crystal in the region where a plurality of patterns do not overlie one another. The use of the region produces an effect of obtaining a high quality crystal (e.g., a crystal substrate or a crystal film) with no dislocations piercing the crystal. In addition, the region where a plurality of patterns do not overlie one another (that is, the region with no dislocations piercing the crystal) is provided without aligning two patterns in the direction of the surfaces including the patterns. This produces another beneficial effect of facilitating the alignment work.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a crystal of a III-V compound of a nitride system, the method comprising:

growing a crystal of a III-V compound of the nitride system having a predetermined thickness on a surface selected from a group of surfaces consisting of a surface of a basal body and a surface of a base layer;

wherein the growth step comprises:

forming a first III-V nitride pattern in one position in the crystal in a direction of a thickness of the crystal, the first pattern including a plurality of first elements distributed in a lateral direction with respect to the crystal at a pitch, each of the first elements forming an elongate stripe extending in a longitudinal direction that is substantially orthogonal to said lateral direction and each of the first elements having at least one width measured in the lateral direction;

depositing an intermediate layer directly on a surface of the first pattern; and forming a second III-V nitride pattern in another position in the crystal in the direction of the thickness of the crystal directly on a surface of said intermediate layer, the second pattern including a plurality of second elements distributed in the lateral direction with respect to the crystal at a pitch, each of the second elements forming an elongate stripe extending in the longitudinal direction and each of the second elements having at least one width measured in the lateral direction;

wherein the pitch of said first pattern and the pitch of said second pattern are different; and wherein the second pattern partly overlies and partly does not overlie said first pattern in the direction of the thickness of the crystal due at least in part to the different pitches of the first pattern and the second pattern.

2. A method of manufacturing a crystal of a III-V compound of a nitride system as claimed in claim 1, wherein the width measured in the lateral direction of at least one of said first pattern elements and the width measured in the lateral direction of at least one of said second pattern elements are different; and wherein the second pattern partly overlies and partly does not overlie said first pattern in the direction of the thickness of the crystal due at least in part to said different widths.

3. A method of manufacturing a crystal of a III-V compound of a nitride system as claimed in claim 1, wherein a relationship between the pitch of the first pattern and the pitch of the second pattern is:

$$0.1 \ \mu m < |p_1 \times p_2/p_2 - p_1| < 5000 \ \mu m$$

where $p_1$ denotes the pitch of the first pattern and $p_2$ denotes the pitch of the second pattern.

4. A method of manufacturing a crystal of a III-V compound of a nitride system as claimed in claim 1, wherein at least one of the first and second patterns has pattern elements arranged in a plurality of different pitches measured in the lateral direction with respect to the crystal.

5. A method of manufacturing a crystal of a III-V compound of a nitride system as claimed in claim 1, wherein the second pattern has at least three different pitches measured in a lateral direction with respect to the crystal.

6. A method of manufacturing a crystal of a III-V compound of a nitride system as claimed in claim 1,
wherein the growth step further comprises:
a first pattern formation step in which the first pattern is formed one of directly on the basal body and on the basal body with the base layer in between;
a first growth step in which the intermediate layer as part of the crystal is deposited on one of the surface of the basal body and on the surface of the base layer with the first pattern formed thereon; and
a second growth step in which a top layer as part of the crystal is deposited on the surface of the intermediate layer with the second pattern formed thereon.

7. A method of manufacturing a crystal of a III-V compound of a nitride system as claimed in claim 6,
wherein at least one of the first pattern and the second pattern is comprised of a masking material.

8. A method of manufacturing a crystal of a III-V compound of a nitride system as claimed in claim 7,
wherein the masking material includes silicon (Si) and at least one selected from the group consisting of oxygen (O) and nitrogen (N).

9. A method of manufacturing a crystal of a III-V compound of a nitride system as claimed in claim 6,
wherein the basal body comprises one of sapphire ($Al_2O_3$), silicon (Si), silicon carbide (SiC), gallium arsenide (GaAs), magnesium aluminum composite oxide ($MgAl_2O_4$), lithium gallium composite dioxide ($LiGaO_2$) and gallium nitride (GaN).

10. A method of manufacturing a crystal of a III-V compound of a nitride system as claimed in claim 6,
wherein the base layer is deposited by growing a III-V compound of the nitride system on the basal body.

11. A method of manufacturing a crystal of a III-V compound of a nitride system as claimed in claim 10,
wherein the first pattern formation step comprises:
forming the first pattern by deposition of a masking material on the surface of the base layer,
and the growth step further comprises:
between the first pattern formation step and the first growth step,
a step of selectively etching the base layer using the first pattern as a mask.

12. A method of manufacturing a crystal of a III-V compound of a nitride system as claimed in claim 10,
wherein the second pattern formation step comprises:
forming the second pattern by deposition of a masking material on the intermediate layer deposited in the first growth step,
and the growth step further comprises:
between the second pattern formation step and the second growth step,
a step of selectively etching the intermediate layer using the second pattern as a mask; and
a step of removing the masking material of the second pattern.

13. A method of manufacturing a crystal of a III-V compound of a nitride system as claimed in claim 6,
wherein the first pattern formation step comprises:
forming the first pattern by forming an indentation in one of the surface of the basal body and in the surface of the base layer.

14. A method of manufacturing a crystal of a III-V compound of a nitride system as claimed in claim 6,
wherein the second pattern formation step comprises:
forming the second pattern by forming an indentation in the surface of the intermediate layer deposited in the first growth step.

15. A method of manufacturing a crystal of a III-V compound of a nitride system as claimed in claim 6, further comprising:
separating at least the basal body from the crystal.

16. A method of manufacturing a crystal of a III-V compound of a nitride system comprising:
growing a crystal of a III-V compound of the nitride system having a predetermined thickness on a surface of a basal body,
wherein the growth step comprises:
forming a first pattern including a plurality of first pattern elements in a first position in the crystal in the direction of the thickness of the crystal, the first pattern elements being distributed in a lateral direction with respect to the crystal and in a longitudinal direction with respect to the crystal that is substantially orthogonal to the lateral direction so that a space separates each set of adjacent first pattern elements of the plurality of first pattern elements in the lateral direction and in the longitudinal direction, the first pattern having a lateral pitch measured in the lateral direction and a longitudinal pitch measured in the longitudinal direction that is substantially the same as the lateral pitch; and
forming a second pattern in a second position in the crystal in the direction of the thickness of the crystal including a plurality of longitudinal pattern elements extending in the longitudinal direction and a plurality of lateral pattern elements extending in the lateral direction to intersect the longitudinal pattern elements, the intersecting elements forming a plurality of spaces between them that are aligned in the lateral direction and in the longitudinal direction, the plurality of longitudinal elements having a pitch measured in the lateral direction and the plurality of lateral elements having a pitch measured in the longitudinal direction that is substantially the same as the lateral pitch;
wherein the pitches of the first pattern are different from the pitches of the second pattern;
wherein the second pattern partly overlies and partly does not overlie the first pattern in the direction of the thickness of the crystal due at least in part to the different pitches;
wherein each of the first and second patterns is arranged in a respective plane and each plane is substantially parallel to the surface of the basal body; and
wherein forming said first pattern includes forming the first pattern including a III-V nitride and/or forming said second pattern includes forming the second pattern including a III-V nitride.

17. A method of manufacturing a device by forming a device film on a surface of one of a crystal substrate and a crystal film, the method comprising:
forming one of the crystal substrate and the crystal film by growing a crystal of a III-V compound of a nitride system having a thickness on a surface of a basal body; and
forming the device film on one of the crystal substrate and the crystal film, the device film having a light-emitting portion including a cladding layer having a protrusion, a contact layer formed on the cladding layer only above the protrusion, and an electrode formed on the contact layer,
wherein the growth step comprises:

forming a first pattern including a plurality of first elements distributed in a lateral direction with respect to the crystal in at least one pitch, the first pattern being formed in one position in the crystal in a direction of the thickness of the crystal, each of the first elements having at least one width measured in the lateral direction; and forming a second pattern including a plurality of second elements distributed in the lateral direction in at least one pitch, the second pattern being formed in another position in the crystal in the direction of the thickness of the crystal, each of the second elements having at least one width measured in the lateral direction;

wherein the second pattern partly overlies and partly does not overlie the first pattern in the direction of the thickness of the crystal;

wherein said light-emitting portion overlies a region of the crystal where the second pattern overlies the first pattern so that dislocations that may form in the crystal adjacent the basal body generally do not reach said light-emitting portion; and wherein forming said first pattern includes forming the first pattern including a III-V nitride and/or forming said second pattern includes forming the second pattern including a III-V nitride.

* * * * *